(12) United States Patent
Liu et al.

(10) Patent No.: US 10,204,870 B2
(45) Date of Patent: Feb. 12, 2019

(54) SEMICONDUCTOR DEVICE AND METHOD OF MANUFACTURING THE SAME

(71) Applicant: TAIWAN SEMICONDUCTOR MANUFACTURING CO., LTD., Hsinchu (TW)

(72) Inventors: Zi-Jheng Liu, Taoyuan (TW); Jo-Lin Lan, Kaohsiung (TW); Yu-Hsiang Hu, Hsinchu (TW); Hung-Jui Kuo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/289,173

(22) Filed: Oct. 8, 2016

(65) Prior Publication Data

US 2017/0317034 A1    Nov. 2, 2017

Related U.S. Application Data

(60) Provisional application No. 62/329,125, filed on Apr. 28, 2016.

(51) Int. Cl.
*H01L 23/544* (2006.01)
*H01L 23/538* (2006.01)
(Continued)

(52) U.S. Cl.
CPC .......... *H01L 23/562* (2013.01); *H01L 21/486* (2013.01); *H01L 21/4857* (2013.01); *H01L 21/78* (2013.01); *H01L 23/3128* (2013.01); *H01L 23/5383* (2013.01); *H01L 23/5384* (2013.01); *H01L 23/5389* (2013.01); *H01L 23/544* (2013.01); *H01L 23/585* (2013.01);
(Continued)

(58) Field of Classification Search
CPC ............... H01L 23/562; H01L 21/4853; H01L 21/4857; H01L 21/486; H01L 21/565
USPC ........................................................ 257/668
See application file for complete search history.

(56) References Cited

U.S. PATENT DOCUMENTS

2006/0076651 A1* 4/2006 Tsutsue ................. H01L 23/562
257/620
2007/0210423 A1* 9/2007 Hsu ...................... H01L 23/5389
257/668

(Continued)

*Primary Examiner* — Matthew L Reames
*Assistant Examiner* — Wilner Jean Baptiste
(74) *Attorney, Agent, or Firm* — Maschoff Brennan

(57) ABSTRACT

A method of manufacturing a semiconductor device includes: receiving a semiconductor structure having a chip region, a seal ring region surrounding the chip region, and a scribe region surroundingly defined around the seal ring region, the semiconductor structure including: a semiconductor chip in the chip region; and a molding compound disposed around the semiconductor chip and distributed in the chip region, the seal ring region and the scribe region; forming an insulating film over the chip region of the semiconductor structure and the seal ring region of the semiconductor structure; forming a seal ring over the seal ring region of the semiconductor structure and laterally adjacent to the insulating film, in which the seal ring has an exposed lateral surface facing away from the insulating film; and forming a protective layer that defines a substantially smooth and inclined lateral surface over the exposed lateral surface of the seal ring.

20 Claims, 8 Drawing Sheets

(51) Int. Cl.
- *H01L 23/00* (2006.01)
- *H01L 23/58* (2006.01)
- *H01L 21/48* (2006.01)
- *H01L 21/78* (2006.01)
- *H01L 23/31* (2006.01)
- *H01L 21/56* (2006.01)

(52) U.S. Cl.
CPC ........ *H01L 21/4853* (2013.01); *H01L 21/561* (2013.01); *H01L 21/568* (2013.01); *H01L 23/5386* (2013.01); *H01L 23/564* (2013.01); *H01L 2223/5446* (2013.01); *H01L 2224/04105* (2013.01); *H01L 2224/12105* (2013.01); *H01L 2224/19* (2013.01); *H01L 2224/73267* (2013.01); *H01L 2224/92244* (2013.01)

(56) References Cited

U.S. PATENT DOCUMENTS

| | | | | |
|---|---|---|---|---|
| 2011/0272800 | A1* | 11/2011 | Chino | H01L 21/561 257/737 |
| 2013/0075936 | A1* | 3/2013 | Lin | H01L 24/19 257/777 |
| 2013/0249075 | A1* | 9/2013 | Tateiwa | H05K 1/185 257/734 |
| 2015/0311132 | A1* | 10/2015 | Kuo | H01L 24/02 257/737 |

* cited by examiner

SEMICONDUCTOR DEVICE AND METHOD OF MANUFACTURING THE SAME

RELATED APPLICATIONS

This application claims priority to U.S. Provisional Application Ser. No. 62/329,125, filed Apr. 28, 2016, which is herein incorporated by reference.

BACKGROUND

Semiconductor devices are typically produced by placing a multiplicity of integrated circuits (ICs), each formed by a plurality of elements and having a predetermined function, in a matrix pattern on, e.g., a semiconductor wafer such as silicon.

A multiplicity of chips placed on the wafer substrate are separated from each other by a scribe region (a scribe line) provided in a grid pattern. After forming a plurality of chips on a single substrate through a semiconductor manufacturing process, the substrate is divided into individual semiconductor devices through dicing the substrate along the scribe region into individual chips.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
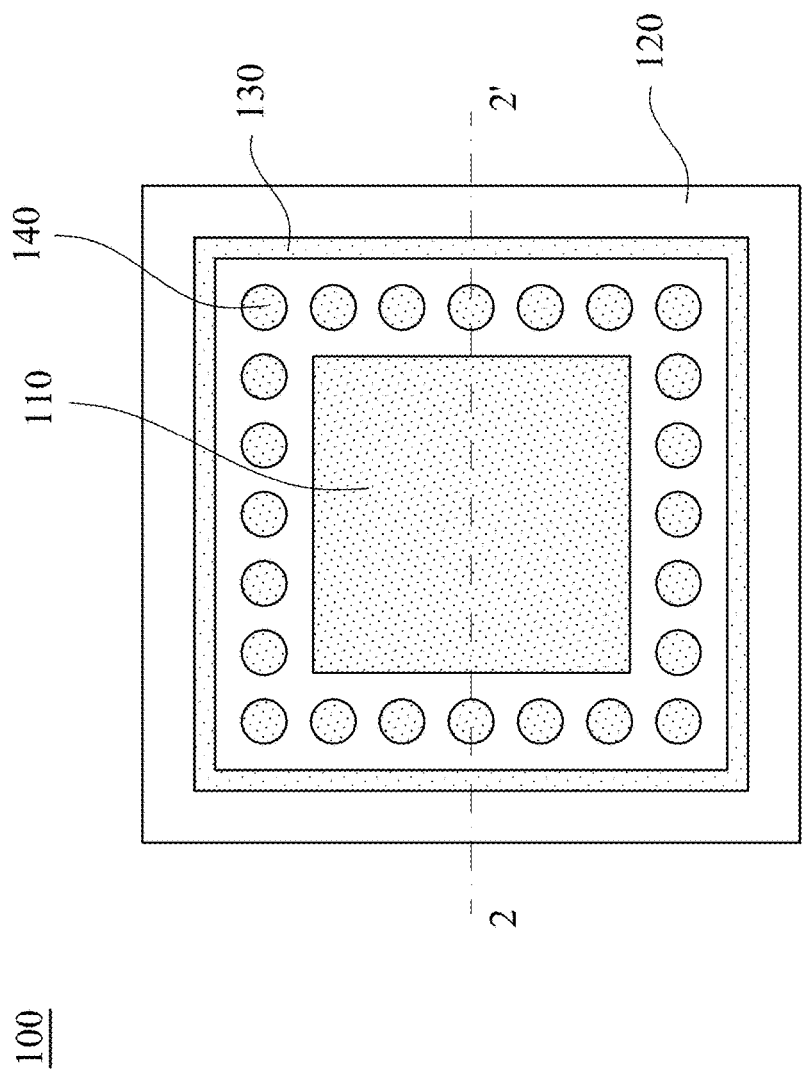
FIG. 1 is a top view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As mentioned above, after forming a plurality of chips on a single substrate through a semiconductor manufacturing process, the substrate is divided into individual semiconductor devices through dicing the substrate along a scribe region into individual chips. If there are a molding compound and insulating layers (e.g., polyimide layers) at the scribe region, a laser pre-cut process may be performed to cut the insulating layers and thus to expose a portion of the molding compound, and a die saw process may then be performed to cut the molding compound. However, the laser pre-cut process is costly.

The present disclosure provides a method of manufacturing a semiconductor device without forming insulating layer at the scribe line region to remove the need for the laser pre-cutting process, thereby reducing production cost. In addition, the method of manufacturing the semiconductor device can avoid a variety of delamination (peeling) during processes, especially wet processes using chemicals, such as photoresist stripping processes or etching processes. Embodiments of the method of manufacturing the semiconductor device will be described below in detail.

FIG. 1 is a top view of a semiconductor structure 100 in accordance with some embodiments of the present disclosure. FIGS. 2 to 5 are cross-sectional views at various stages of manufacturing a semiconductor device 50 in accordance with some embodiments of the present disclosure.

Figure 2:
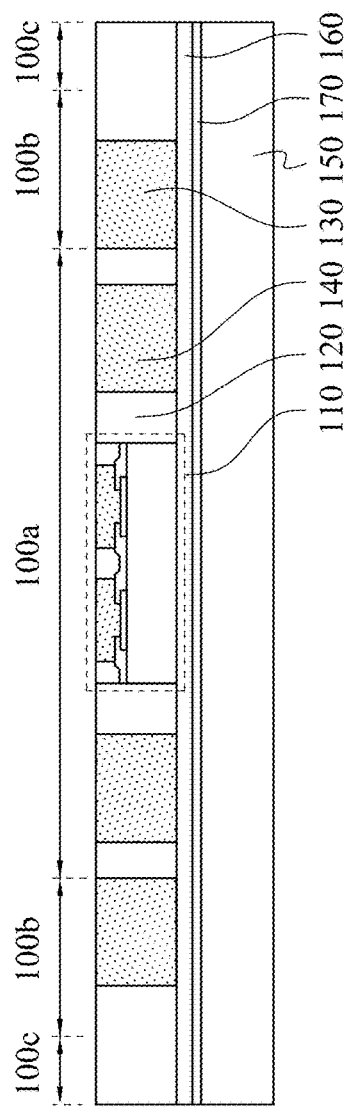
FIGS. 2 to 5 are cross-sectional views at various stages of manufacturing a semiconductor device in accordance with some embodiments of the present disclosure.

FIG. 2 is a cross-sectional view of the semiconductor structure 100 taken along a section line 2-2' of FIG. 1 in accordance with some embodiments of the present disclosure. As shown in FIGS. 1 and 2, a semiconductor structure 100 is illustrated. Referring to the top view of FIG. 1, in practical applications, there may be a plurality of chip regions defined over a wafer (only one is shown here), and the chip regions are separated from each other by a plurality of ring-shaped seal ring regions (not shown). In addition, a plurality of scribe lines/regions (not shown) is provided in a grid pattern to virtually separate adjacent chips on the wafer from one another. The semiconductor structure 100 has a chip region 100a, a seal ring region 100b surrounding the chip region 100a, and a scribe region 100c surroundingly defined around the seal ring region 100b.

The semiconductor structure 100 includes a semiconductor chip (die) 110 and a molding compound 120 disposed around the semiconductor chip 110, as shown in FIG. 1. As shown in FIG. 2, the semiconductor chip 110 is in the chip region 100a. The molding compound 120 is distributed in the chip region 100a, the seal ring region 100b, and the scribe region 100c. In some embodiments, the semiconductor chip 110 has an upper surface coplanar with an upper surface of the molding compound 120.

In some embodiments, as shown in FIG. 2, the semiconductor structure 100 further includes a conductive pattern 130 in the seal ring region 100b. In some embodiments, the conductive pattern 130 is separated from the semiconductor chip 110. In some embodiments, the conductive pattern 130 has an upper surface coplanar with an upper surface of the molding compound 120. In some embodiments, the conductive pattern 130 includes copper. In some embodiments, as shown in FIG. 1, the conductive pattern 130 comprises a rectangular ring-like profile that continuously surrounds the semiconductor chip 110. In some embodiments, as shown in FIG. 1, a side of the conductive pattern 130 is substantially parallel to a side of the semiconductor chip 110.

In some embodiments, as shown in FIG. 2, the semiconductor structure 100 further includes a through via 140 in the chip region 100a. In some embodiments, the through via 140 is configured to connect other components (not shown). In some embodiments, the through via 140 is a through InFO (integrated fan-out) via (TIV). In some embodiments, the through via 140 is arranged laterally between the semiconductor chip 110 and the conductive pattern 130. In some embodiments, the through via 140 includes copper. In some embodiments, as shown in FIG. 1, a plurality of circular-shaped through vias 140 are arranged around the semiconductor chip 110, and are further surrounded by the ring-shaped conductive pattern 130.

As shown in FIG. 2, the semiconductor structure 100 further includes a carrier substrate 150 beneath the semiconductor chip 110 and the molding compound 120. In some embodiments, the carrier substrate 150 is also beneath the conductive pattern 130 and the through via 140. In some embodiments, the carrier substrate 150 is configured to support the semiconductor chip 110 and the molding compound 120 during a series of processes, such as photolithographic and etching processes, electroplating processes and/or mounting processes. In some embodiments, the carrier substrate 150 is made of glass, quartz or any other suitable material.

As shown in FIG. 2, the semiconductor structure 100 further includes an insulating layer 160 arranged between the semiconductor chip 110/molding compound 120 and the carrier substrate 150. In some embodiments, the insulating layer 160 includes polyimide resin.

In some embodiments, the semiconductor structure 100 further includes a release layer 170 between the insulating layer 160 and the carrier substrate 150. In some embodiments, the release layer 170 is configured to separate the carrier substrate 150 from the insulating layer 160. In some embodiments, the release layer 170 is a light to heat conversion layer (LTHC).

Figure 3:
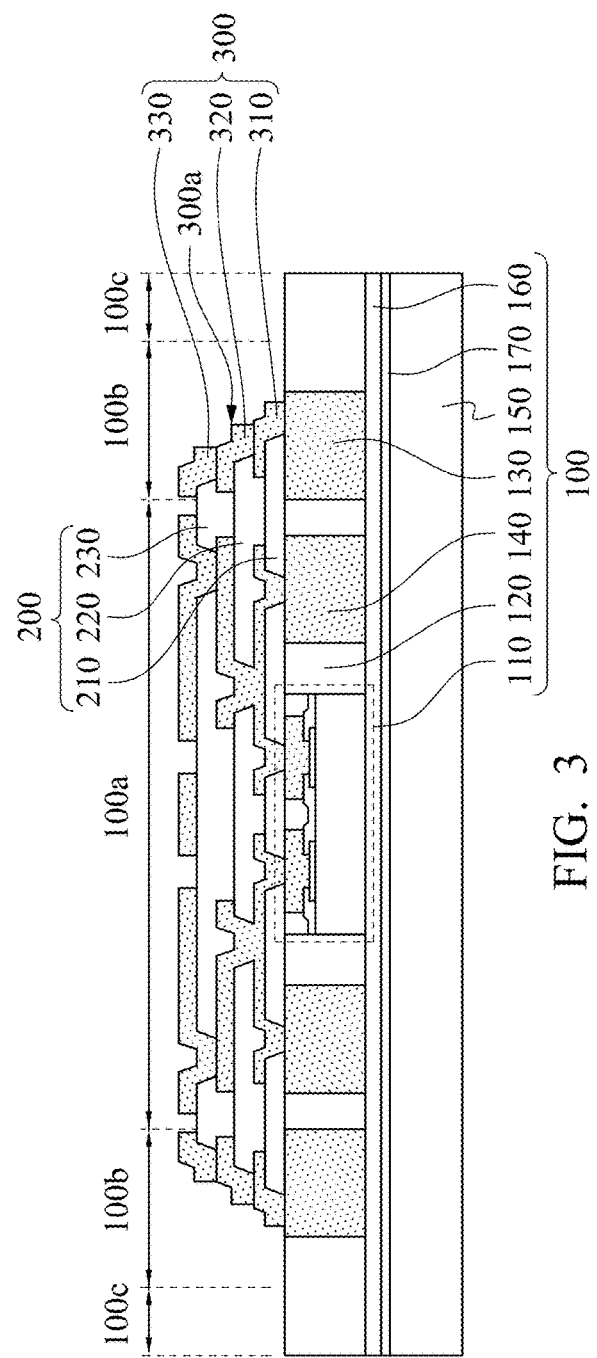

As shown in FIG. 3, an insulating film 200 is formed over the chip region 100a of the semiconductor structure 100 and the seal ring region 100b of the semiconductor structure 100. In addition, a seal ring 300 is formed over the seal ring region 100b of the semiconductor structure 100. The seal ring 300 is formed laterally adjacent to the insulating film 200 and has an exposed lateral surface 300a facing away from the insulating film 200. In some embodiments, the seal ring 300 is formed over and in contact with the conductive pattern 130.

In some embodiments, forming the insulating film 200 includes forming a plurality of insulating layers stacked to each other and in a stair-like configuration, such as a first insulating layer 210, a second insulating layer 220, and a third insulating layer 230, as shown in FIG. 3. In some embodiments, the seal ring 300 includes a plurality of conductive layers/features connected to each other, such as a first conductive layer/feature 310, a second conductive layer/feature 320 and a third conductive layer/feature 330, as shown in FIG. 3. In some embodiments, forming the seal ring 300 includes forming a stair-like portion (e.g., the first, second and third conductive features 310, 320 and 330) of the seal ring 300 laterally adjacent to the insulating layers (e.g., the first, second and third insulating layers 210, 220 and 230) in the stair-like configuration. Embodiments of forming the insulating film 200 and the seal ring 300 will be described in detail below.

In some embodiments, the first insulating layer 210 is formed over the chip region 100a of the semiconductor structure 100 and the seal ring region 100b of the semiconductor structure 100. In some embodiments, a first insulating material (not shown) is blanket formed (e.g. by spin coating) over the chip region 100a and the seal ring region 100b and then patterned, e.g. using a photolithographic (including exposure and development) process, to form the first insulating layer 210. In some embodiments, the first insulating layer 210 includes polyimide resin.

In some embodiments, forming the first insulating layer 210 further includes forming the first insulating layer 210 over and in contact with the conductive pattern 130. In some embodiments, the conductive pattern 130 has great light reflection compared to the molding compound 120, resulting in large process window of the exposure process. Therefore, the conductive pattern 130 can help to form small via openings (e.g., diameter less than or equal to 10 microns) of the first insulating layer 210.

In some embodiments, the first conductive layer 310 is formed over the chip region 100a of the semiconductor structure 100 and the seal ring region 100b of the semiconductor structure 100 and laterally adjacent to a peripheral portion (not marked) of the first insulating layer 210. In some embodiments, the first conductive layer 310 formed over the seal ring region 100b is aced as a portion of the seal ring 300, and the first conductive layer 310 formed over the chip region 100a is acted as a portion of an interconnect structure (not marked). In some embodiments, a first conductive material is blanket formed (e.g., by electroplating) over the first insulating layer 210 and then patterned (e.g. using photolithographic and etching processes) to form the first conductive layer 310. In some embodiments, the first conductive layer 310 includes copper.

In some embodiments, the second insulating layer 220 is formed over the first insulating layer 210 yet exposing a lateral surface of the first conductive feature 310 facing away from the first insulating layer 210. In some embodiments, a second insulating material (not shown) is blanket formed (e.g. by spin coating) over the first insulating layer 210 and the first conductive layer 310 and then patterned (e.g. using a photolithographic (including exposure and development) process) to form the second insulating layer 220. In some embodiments, the second insulating layer 220 includes polyimide resin.

In some embodiments, the second conductive layer 320 is formed over and laterally adjacent to a peripheral portion of the second insulating layer 220 yet exposing a lateral surface of the second conductive feature 320 facing away the second insulating layer 220. In some embodiments, the second conductive layer 320 is formed over and in contact with the peripheral portion of the second insulating layer 220 and the first conductive feature 310. In some embodiments, the second conductive layer 320 formed over the seal ring region 100b is aced as a portion of the seal ring 300, and the second conductive layer 320 formed over the chip region 100a is acted as a portion of the interconnect structure (not marked). In some embodiments, a second conductive material is blanket formed (e.g., by electroplating) over the second insulating layer 220 and the first conductive feature 310 and then patterned (e.g. using photolithographic and etching processes) to form the second conductive layer 320. In some embodiments, the second conductive layer 320 includes copper.

In some embodiments, the third insulating layer 230 is formed over the second insulating layer 220 yet exposing the lateral surface of the second conductive feature 320 facing away the second insulating layer 220. In some embodiments, a third insulating material (not shown) is blanket formed (e.g. by spin coating) over the second insulating layer 220 and the second conductive layer 320 and then patterned (e.g. using a photolithographic (including exposure and development) process) to form the third insulating layer 230. In some embodiments, the third insulating layer 230 includes polyimide resin.

In some embodiments, the third conductive layer 330 is formed over and laterally adjacent to a peripheral portion of the third insulating layer 230. In some embodiments, the third conductive layer 330 is formed over and in contact with the peripheral portion of the third insulating layer 230 and the second conductive layer 320. In some embodiments, the third conductive layer 330 formed over the seal ring region 100b is aced as a portion of the seal ring 300, and the third conductive layer 330 formed over the chip region 100a is acted as a portion of the interconnect structure (not marked). In some embodiments, a third conductive material is blanket formed (e.g., by electroplating) over the third insulating layer 230 and the second conductive layer 320 and then patterned (e.g. using photolithographic and etching processes) to form the third conductive layer 330. In some embodiments, the third conductive layer 330 includes copper.

Figure 4:
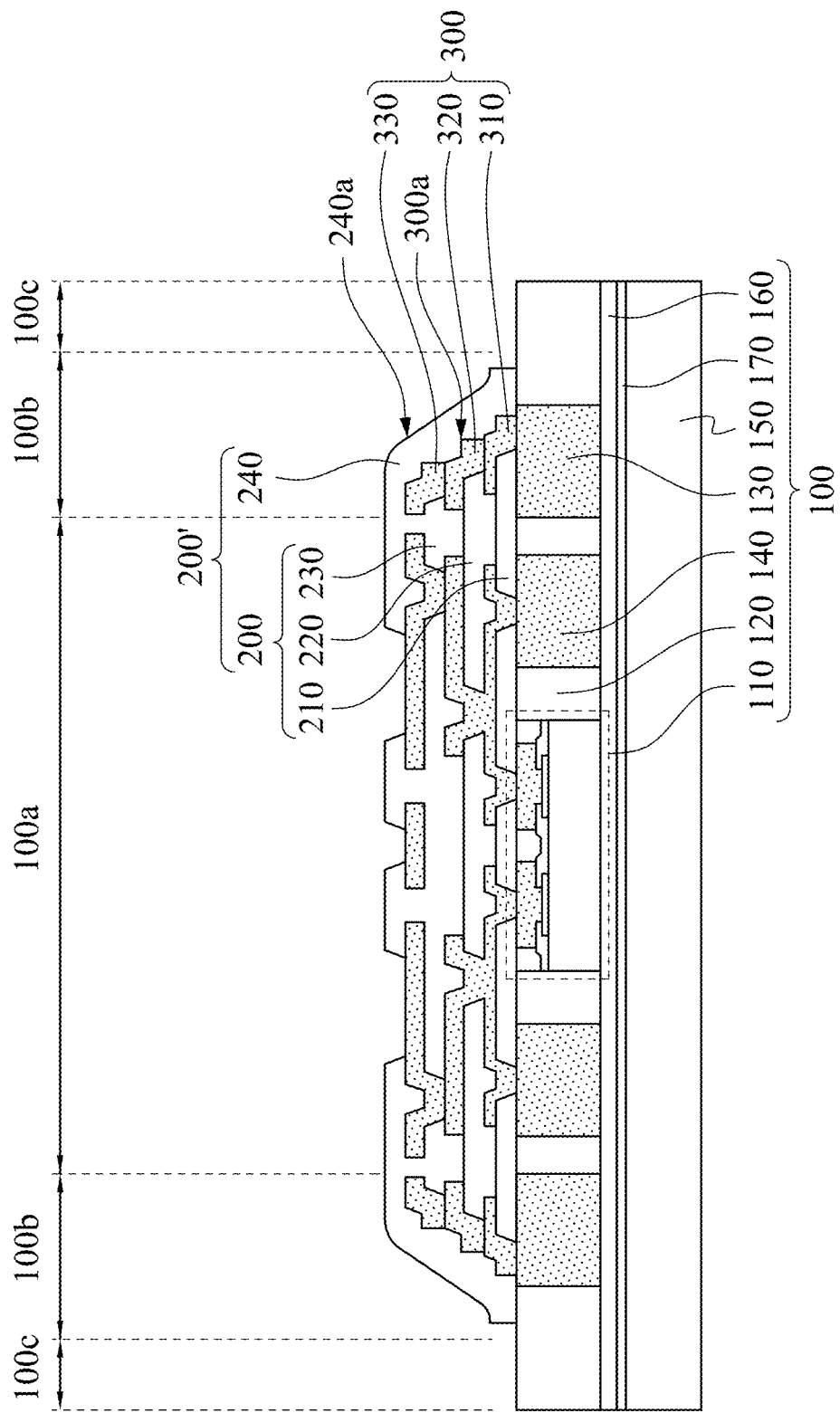
Figure 10:
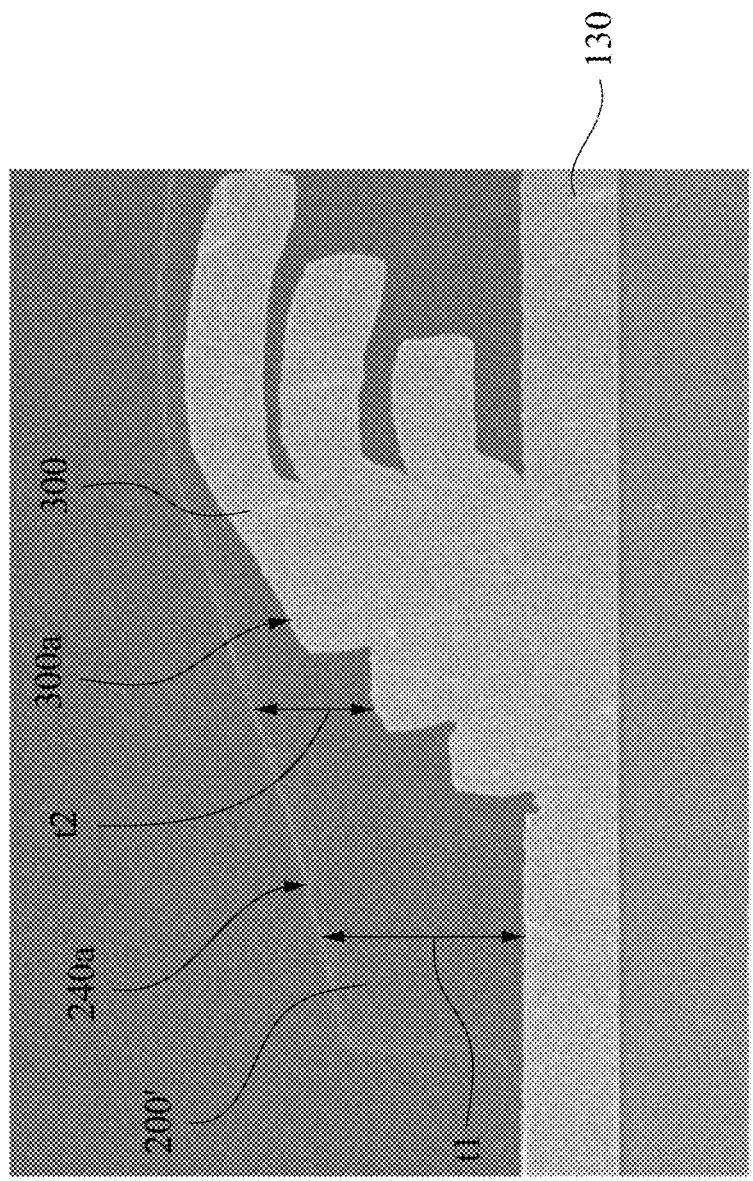
FIG. 10 is a SEM image of a seal ring and an insulating structure in accordance with some embodiments of the present disclosure.

As shown in FIG. 4, after the insulating film 200 and the seal ring 300 are formed, a protective layer 240 is formed that defines an substantially smooth and inclined lateral surface 240a over the exposed lateral surface 300a of the seal ring 300. In some embodiments, the substantially smooth and inclined lateral surface 240a is formed over the exposed lateral surfaces of the first and second conductive features 310 and 320. In some embodiments, forming the protective layer 240 includes forming the protective layer 240 that defines the substantially smooth and inclined lateral surface 240a over the stair-like portion of the seal ring 300. The term "substantially smooth and inclined lateral surface" herein refers to the inclined lateral surface having a profile without abrupt ups and downs in an enlarged cross-sectional view, e.g., as shown in FIG. 10. In some embodiments, the protective layer 240 is formed in contact with the first conductive feature 310 and the second conductive layer 320. In some embodiments, the protective layer 240 is formed further in contact with the third conductive layer 330. In some embodiments, the protective layer 240 is made of a same material as the insulating film 200. In some embodiments, the protective layer 240 is made of a same material as the first insulating layer 210, the second insulating layer 220 or the third insulating layer 230. In some embodiments, the protective layer 240 includes polyimide resin. In some embodiments, a protective material (not shown) is blanket formed (e.g., by spin coating) over the insulating film 200 and the seal ring 300, and then patterned (e.g., using a photolithographic (including exposure and development) process) to form the protective layer 240.

In some embodiments, because of the protective layer 240, the stair-like portion of the seal ring 300 and the insulating film 200 in the stair-like configuration, no delamination occurs between the insulating film 200 and the semiconductor structure 100 (e.g., between the first insulating layer 210 and the conductive pattern 130) or between the protective layer 240 and the conductive pattern 130. Also, no delamination occurs between the first and second insulating layers 210, 220, or between the second and third insulating layers 220, 230, or between the third insulating layer 230 and the protective layer 240. In some embodiments, the seal ring 300 and the conductive pattern 130 constitutes a full wall to provide excellent moisture protection.

Figure 5:
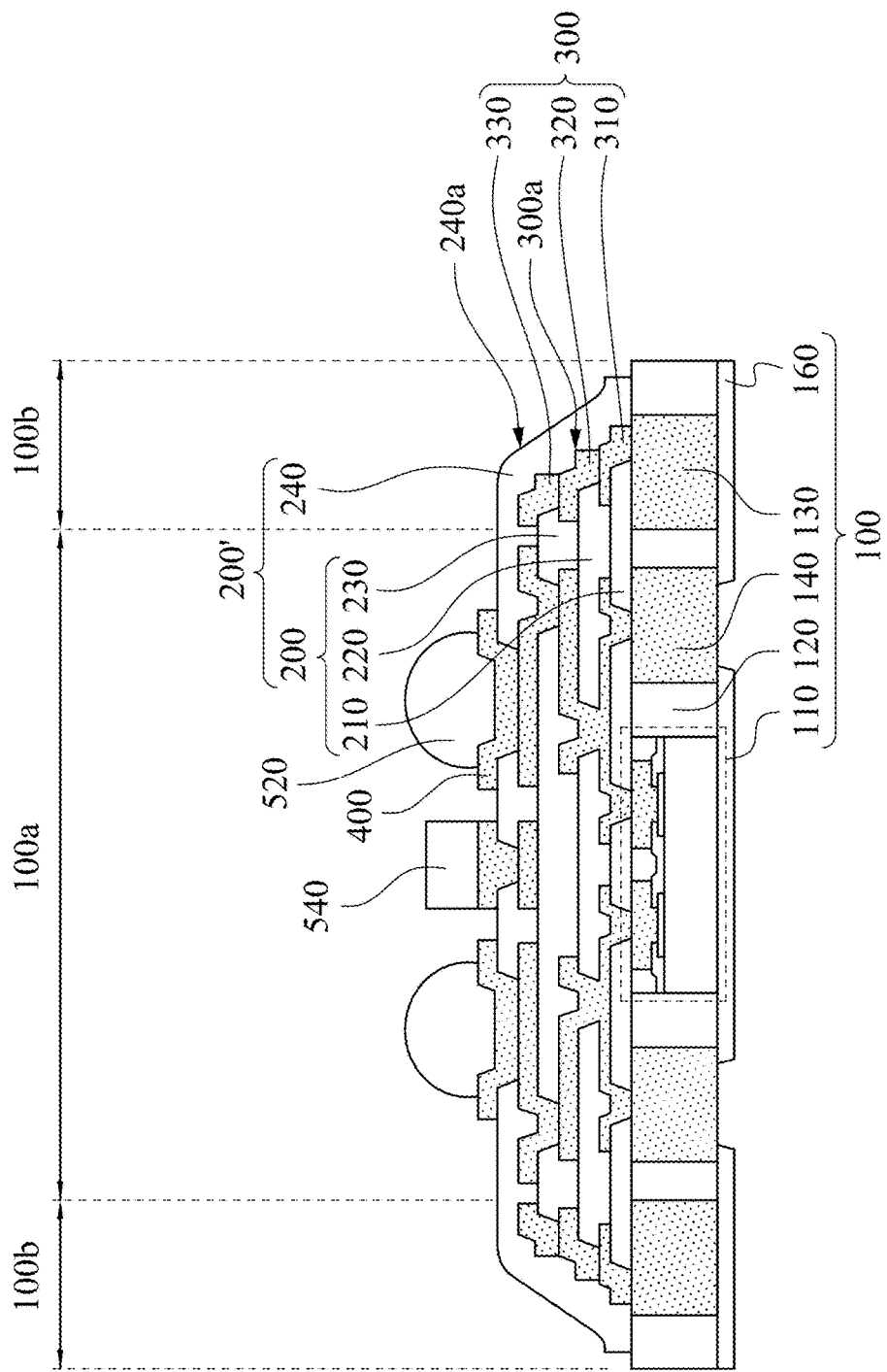
Figure 6:
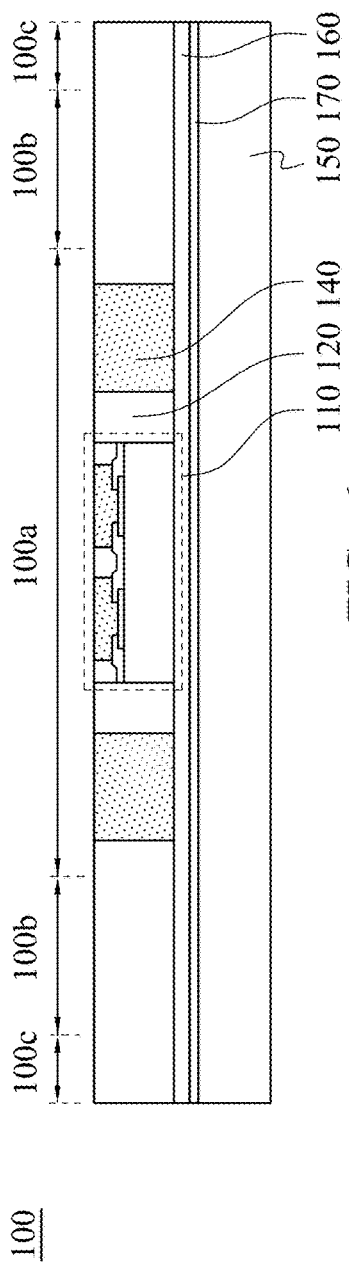
FIGS. 6 to 9 are cross-sectional views at various stages of manufacturing a semiconductor device in accordance with some embodiments of the present disclosure.
Figure 7:
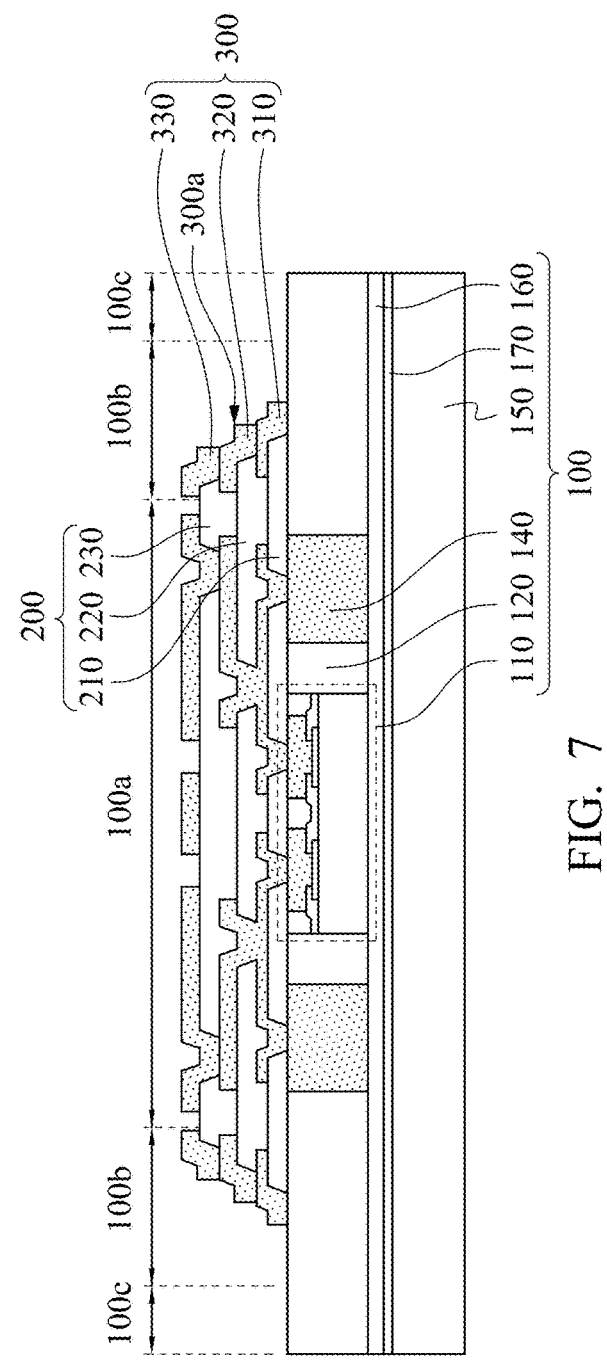
Figure 8:
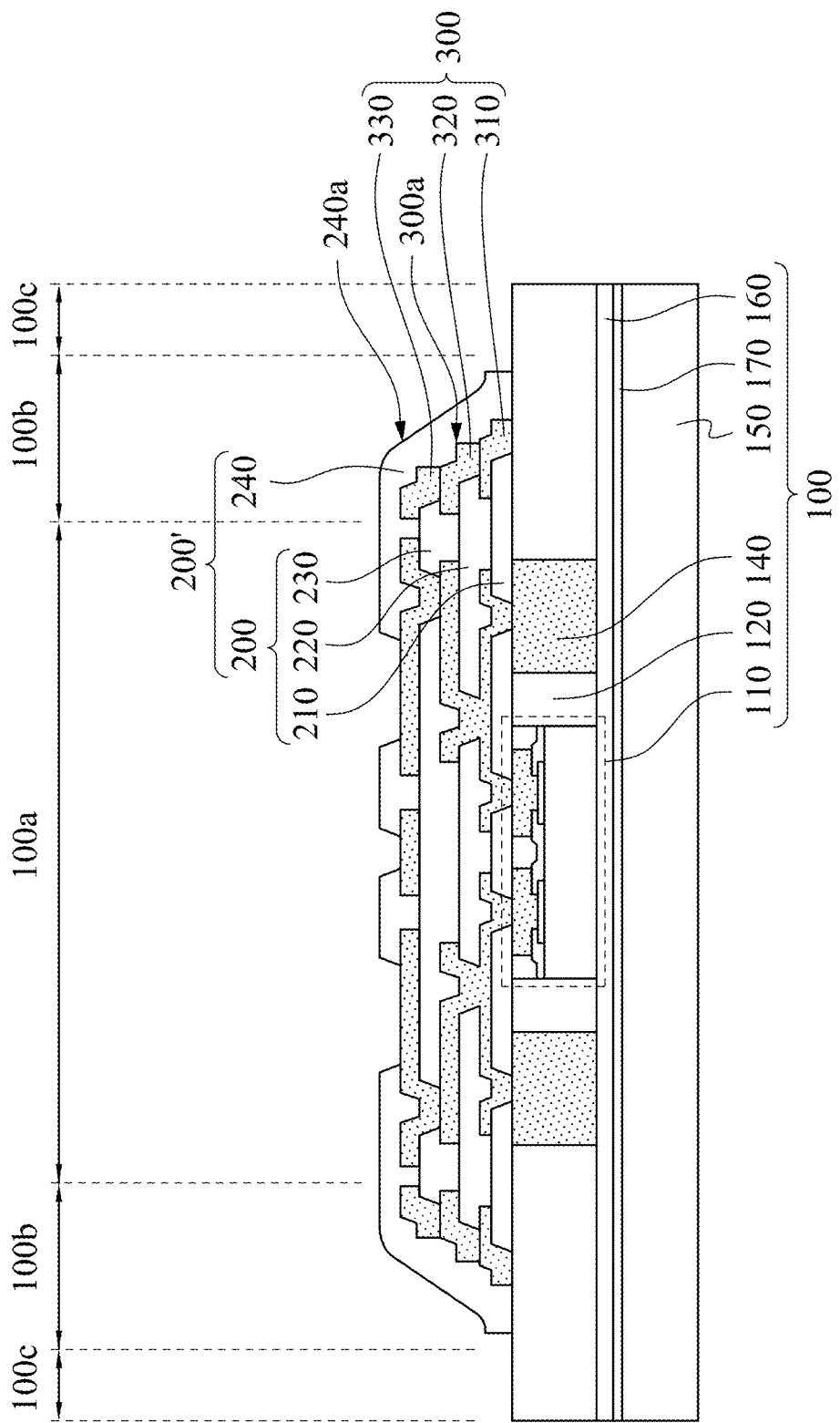

As shown in FIG. 5, after the protective layer 240 is formed, a plurality of under-bump-metallurgies (UBMs) 400 are formed over and in contact with the third conductive layer 330. In some embodiments, after the UBMs 400 are formed, balls 520 and a device 540 are formed respectively in contact with the UBMs 400. In some embodiments, the balls 520 constitutes a ball grid array (BGA), and the ball 520 may also be called as a BGA pad. In some embodiments, the device 540 is an integrated passive device (IPD).

In some embodiments, after the balls 520 and the device 540 are formed, the carrier substrate 150 is removed. In some embodiments, the carrier substrate 150 is removed using a de-bonding process (e.g., laser process). Specifically, as shown in FIGS. 4 and 5, the de-bonding process is performed to remove the release layer 170, and thus to separate the insulating layer 160 and the structure thereover from the carrier substrate 150.

In some embodiments, after the de-bonding process is performed, a laser drill process is performed to form through holes (not marked) through the insulating layer 160 to expose the through vias 140, as shown in FIG. 5. In some embodiments, as shown in FIGS. 4 to 5, after the laser drill process is performed, a dicing process is performed to dice the molding compound 120 along the scribe region 100c of the semiconductor substrate 100. There is no need for a laser pre-cut process due to no insulating layer over the scribe region 100c of the semiconductor structure 100 of FIG. 4.

FIGS. 6 to 9 are cross-sectional views at various stages of manufacturing a semiconductor device 90 in accordance with some embodiments of the present disclosure. The difference between the embodiments of FIGS. 6 to 9 and those of FIGS. 2 to 5 is that the semiconductor structure 100 of FIGS. 2 to 5 further includes the conductive pattern 130. Embodiments of FIGS. 6 to 9 may be same as or similar to those of FIGS. 2 to 5, and thus are omitted herein.

Figure 9:
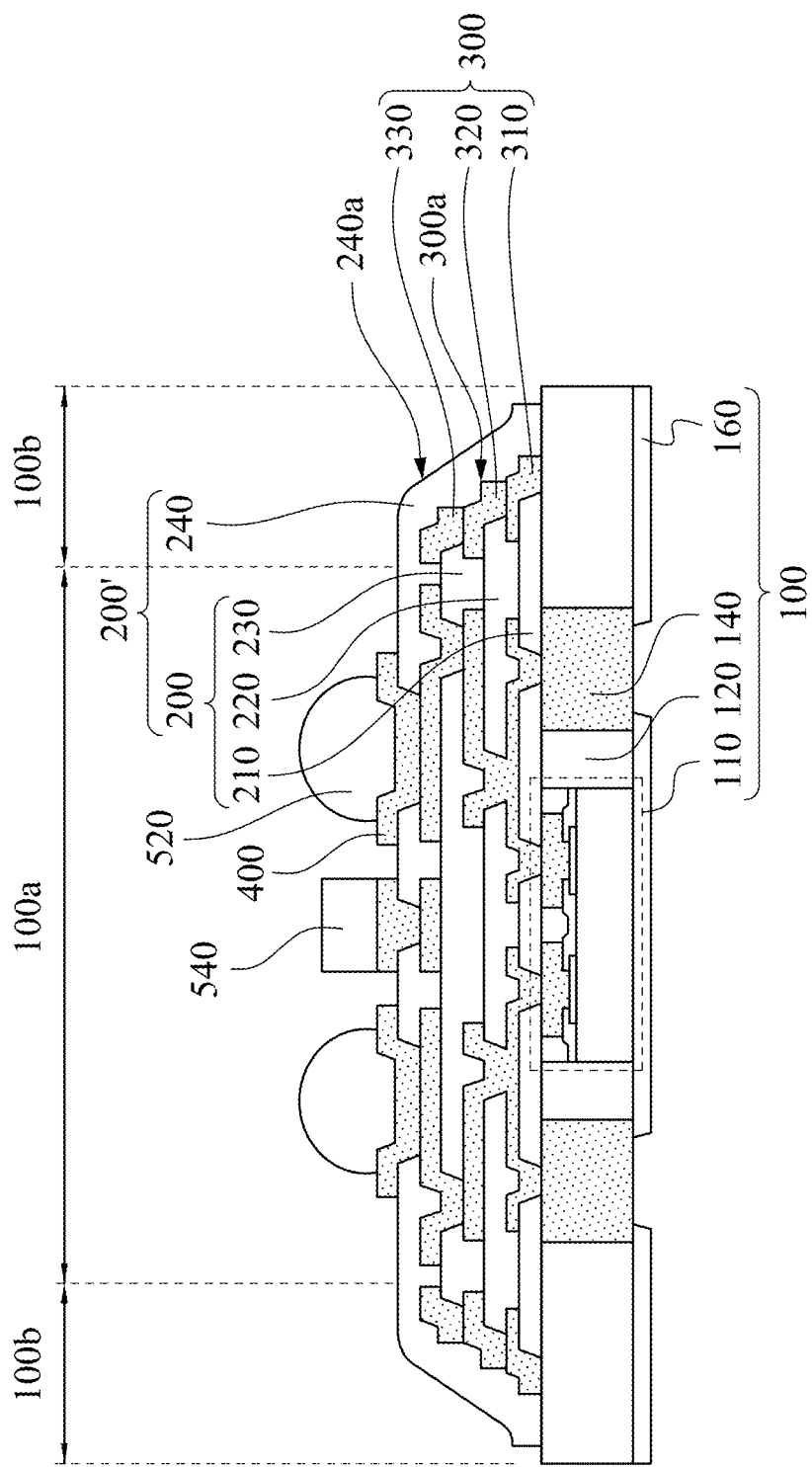

Similar to the embodiments of FIGS. 2 to 5, in some embodiments, as shown in FIG. 9, because of the protective layer 240, the stair-like portion of the seal ring 300 and the insulating film 200 in the stair-like configuration, no delamination occurs between the insulating film 200 and the semiconductor structure 100 (e.g., between the first insulating layer 210 and the molding compound 120) or between the protective layer 240 and the molding compound 120. Also, no delamination occurs between the first and second insulating layers 210, 220, or between the second and third insulating layers 220, 230, or between the third insulating layer 230 and the protective layer 240.

The present disclosure further provides a semiconductor device. As shown in FIG. 5 or 9, the semiconductor device 50 or 90 includes a semiconductor structure 100, an insulating structure 200' and a seal ring 300.

The semiconductor structure 100 has a chip region 100a and a seal ring region 100b surrounding the chip region 100a. The semiconductor structure 100 includes a semiconductor chip 110 and a molding compound 120 surrounding the semiconductor chip 110, as shown in FIG. 1. As shown in FIG. 5 or 9, the semiconductor chip 110 is in the chip region 100a. The molding compound 120 is in the chip region 100a and the seal ring region 100b. In some embodiments, the semiconductor chip 110 has an upper surface coplanar with an upper surface of the molding compound 120.

The insulating structure 200' is disposed over the chip region 100a of the semiconductor structure 100 and the seal ring region 100b of the semiconductor structure 100. The insulating structure 200' has a substantially smooth and inclined exposed lateral surface 240a and covers the seal ring 300. The term "substantially smooth and inclined lateral exposed surface" herein refers to the inclined lateral exposed surface having a profile without noticeable ups and downs in an cross-sectional view, such as shown in FIG. 10. In some embodiments, the substantially smooth and inclined exposed lateral surface 240a of the insulating structure 200' obliquely extends upwardly from the seal ring region 100b of the semiconductor structure 100 toward the chip region 100a of the semiconductor structure 100. In some embodiments, the insulating structure 200' is constituted by a plurality of insulating layers, such as a first insulating layer 210, a second insulating layer 220, a third insulating layer 230 and a protective layer 240. In some embodiments, the first insulating layer 210, the second insulating layer 220, the third insulating layer 230 and the protective layer 240 include polyimide resin. In some embodiments, the first insulating layer 210, the second insulating layer 220, the third insulating layer 230 and the protective layer 240 are made of a same material.

The seal ring 300 is positioned over the seal ring region 100b of the semiconductor structure 100 and covered by the insulating structure 200'. In some embodiments, as shown in FIG. 5 or 9, the seal ring 300 includes a plurality of Z-shaped or L-shaped portions 310, 320 and 330 connected to each other. In some embodiments, the seal ring 300 is stair-shaped. In some embodiments, the seal ring 300 is obliquely extended upwardly from the seal ring region 100b of the semiconductor structure 100 toward the chip region 100a of the semiconductor structure 100.

In some embodiments, as shown in FIG. 5 or 9, the seal ring 300 has a stair-shaped outer lateral surface 300a. The "outer lateral surface 300a" of the seal ring 300 refers to the lateral surface of the seal ring 300 facing away from the chip region 100a. FIG. 10 provides an SEM image of a seal ring 300 and an insulating structure 200' in accordance with some exemplary embodiments of the present disclosure. As shown in FIG. 10, the seal ring 300 has the stair-shaped outer lateral surface 300a, and the insulating structure 200' has a substantially smooth and inclined exposed lateral surface 240a.

In some embodiments, as shown in FIG. 9, the seal ring 300 is in contact with the molding compound 120. In some embodiments, as shown in FIG. 5, the semiconductor structure 100 further includes a conductive pattern 130 in the seal ring region 100b of the semiconductor structure 100 and in contact with the seal ring 300. In some embodiments, the conductive pattern 130 has an upper surface coplanar with an upper surface of the molding compound 120. In some embodiments, the conductive pattern 130 includes copper. In some embodiments, as shown in FIG. 1, the conductive pattern 130 is ring-shaped and surrounding the semiconductor chip 110. In some embodiments, as shown in FIG. 1, a side of the conductive pattern 130 is substantially or entirely parallel to a side of the semiconductor chip 110.

In some embodiments, the insulating structure 200' is in contact with the conductive pattern 130, as shown in FIG. 5 or 10. In some embodiments, as shown in FIG. 10, the insulating structure 200' over and in contact with the conductive pattern 130 has a thickness t1 greater than a thickness t2 of the insulating structure 200' over and in contact with the seal ring 300.

In some embodiments, as shown in FIG. 5 or 9, the semiconductor structure 100 further includes a through via 140 in the chip region 100a. In some embodiments, the through via 140 is configured to connect other components (not shown). In some embodiments, the through via 140 is a through InFO (integrated fan-out) via (TIV). In some embodiments, the through via 140 includes copper. In some embodiments, as shown in FIG. 1, a plurality of circular-shaped through vias 140 are arranged surrounding the semiconductor chip 110 and surrounded by the ring-shaped conductive pattern 130.

In some embodiments, as shown in FIG. 5 or 9, the semiconductor structure 100 further includes an insulating layer 160 beneath the semiconductor chip 110 and the molding compound 120. In some embodiments, the insulating layer 160 includes polyimide resin. In some embodiments, the insulating layer 160 includes through holes (not marked) to expose portions of the through via 140.

In some embodiments, as shown in FIG. 5 or 9, the semiconductor device 50 or 90 further includes a plurality of under-bump-metallurgies (UBMs) 400 over the insulating structure 200'. In some embodiments, the semiconductor device 50 or 90 further includes balls 520 and a device 540 respectively in contact with the UBMs 400.

In some embodiments, as shown in FIG. 5 or 9, the semiconductor device 50 or 90 further includes an interconnect structure (not marked) over the chip region 100a of the semiconductor structure 100 and covered by the insulating structure 200'. In some embodiments, the balls 520 are electrically connected to the semiconductor chip 110 and the through vias 140 through the interconnect structure.

According to some embodiments, a method of manufacturing a semiconductor device includes: receiving a semiconductor structure having a chip region, a seal ring region surrounding the chip region and a scribe region surroundingly defined around the seal ring region, the semiconductor structure including: a semiconductor chip in the chip region; and a molding compound disposed around the semiconductor chip and distributed in the chip region, the seal ring region and the scribe region; forming an insulating film over the chip region of the semiconductor structure and the seal ring region of the semiconductor structure; forming a seal ring over the seal ring region of the semiconductor structure and laterally adjacent to the insulating film, in which the seal ring has an exposed lateral surface facing away from the insulating film; and forming a protective layer that defines a substantially smooth and inclined lateral surface over the exposed lateral surface of the seal ring.

According to some embodiments, a method of manufacturing a semiconductor device includes: receiving a semiconductor structure having a chip region, a seal ring region surrounding the chip region and a scribe region surrounding the seal ring region, the semiconductor structure including: a semiconductor chip in the chip region; and a molding compound in the chip region, the seal ring region and the scribe region, and surrounding the semiconductor chip; forming a first insulating layer over the chip region of the semiconductor structure and the seal ring region of the semiconductor structure; forming a first conductive feature over the seal ring region of the semiconductor structure and laterally adjacent to a peripheral portion of the first insulating layer; forming a second insulating layer over the first insulating layer yet exposing a lateral surface of the first conductive feature facing away the first insulating layer; forming a second conductive feature over and laterally adjacent to a peripheral portion of the second insulating layer yet exposing a lateral surface of the second conductive feature facing away the second insulating layer; and forming a protective layer that defines a substantially smooth and inclined lateral surface over the exposed lateral surfaces of the first and second conductive features.

According to some embodiments, a semiconductor device includes a semiconductor structure, a seal ring and an insulating structure. The semiconductor structure has a chip region and a seal ring region surrounding the chip region. The semiconductor structure includes a semiconductor chip in the chip region; and a molding compound in the chip region and the seal ring region, and surrounding the semiconductor chip. The seal ring is over the seal ring region of the semiconductor structure. The insulating structure is over the chip region of the semiconductor structure and the seal ring region of the semiconductor structure, in which the insulating structure includes a substantially smooth and inclined exposed lateral surface and covers the seal ring.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a semiconductor structure having a chip region and a seal ring region surrounding the chip region, the semiconductor structure comprising:
        a semiconductor chip in the chip region;
        a conductive pattern in the seal ring region; and
        a molding compound in the chip region and the seal ring region and surrounding the semiconductor chip, wherein the conductive pattern has an upper surface coplanar with an upper surface of the molding compound;
    a seal ring over the seal ring region of the semiconductor structure; and
    an insulating structure over the chip region of the semiconductor structure and the seal ring region of the semiconductor structure, wherein the insulating structure includes a top portion that covers a top surface of the seal ring, a bottom portion that covers a side surface of the seal ring, and a smooth and inclined lateral surface that extends from the top portion to the bottom portion thereof.

2. The semiconductor device of claim 1, wherein the conductive pattern is in contact with the seal ring.

3. The semiconductor device of claim 1, wherein the conductive pattern is ring-shaped and surrounds the semiconductor chip.

4. The semiconductor device of claim 1, wherein the insulating structure is in contact with the conductive pattern.

5. The semiconductor device of claim 4, wherein the insulating structure over and in contact with the conductive pattern has a thickness greater than a thickness of the insulating structure over and in contact with the seal ring.

6. The semiconductor device of claim 1, wherein the seal ring is in contact with the molding compound.

7. The semiconductor device of claim 1, wherein the seal ring is stair-shaped.

8. The semiconductor device of claim 1, wherein the seal ring has a stair-shaped outer lateral surface.

9. The semiconductor device of claim 1, wherein the seal ring is obliquely extended upwardly from the seal ring region of the semiconductor structure toward the chip region of the semiconductor structure.

10. The semiconductor device of claim 1, wherein the smooth and inclined lateral surface is obliquely extended upwardly from the seal ring region of the semiconductor structure toward the chip region of the semiconductor structure.

11. A semiconductor device, comprising:
    a semiconductor structure having a chip region and a seal ring region surrounding the chip region, the semiconductor structure comprising:
        a semiconductor chip in the chip region;
        a molding compound in the chip region and the seal ring region, and surrounding the semiconductor chip;
        a conductive pattern in the seal ring region and having an upper surface coplanar with an upper surface of the molding compound; and
    a seal ring over the seal ring region of the semiconductor structure, wherein the seal ring surrounds the semiconductor chip; and
    an insulating structure over the semiconductor structure and covering the seal ring.

12. The semiconductor device of claim 11, wherein the conductive pattern is in contact with the seal ring.

13. The semiconductor device of claim 11, wherein the conductive pattern is ring-shaped and surrounds the semiconductor chip.

14. The semiconductor device of claim 11, wherein the insulating structure is in contact with the conductive pattern.

15. The semiconductor device of claim 14, wherein the insulating structure over and in contact with the conductive pattern has a thickness greater than a thickness of the insulating structure over and in contact with the seal ring.

16. The semiconductor device of claim 11, wherein the seal ring is obliquely extended upwardly from the seal ring region of the semiconductor structure toward the chip region of the semiconductor structure.

17. The semiconductor device of claim 11, wherein the conductive pattern further has a lower surface coplanar with the lower surface of the molding compound.

18. A semiconductor device, comprising:
    a semiconductor structure having a chip region and a seal ring region surrounding the chip region, the semiconductor structure comprising:
        a semiconductor chip in the chip region;
        a molding compound in the chip region and the seal ring region, and surrounding the semiconductor chip;
        a through via having an upper surface coplanar with an upper surface of the molding compound and a lower surface coplanar with a lower surface of the molding compound; and
        a conductive pattern surrounding the through via and having an upper surface coplanar with the upper surface of the molding compound and a lower surface coplanar with the lower surface of the molding compound.

19. The semiconductor device of claim 18, wherein the semiconductor structure further comprises an insulating layer that entirely covers the lower surface of the conductive pattern.

20. The semiconductor device of claim 18, wherein the conductive pattern is decoupled from the semiconductor chip.

* * * * *